United States Patent
Ueno et al.

(10) Patent No.: US 11,739,168 B2
(45) Date of Patent: Aug. 29, 2023

(54) PHOTOCURABLE COMPOSITION

(71) Applicant: THREEBOND CO., LTD., Hachioji (JP)

(72) Inventors: Kazuyuki Ueno, Hachioji (JP); Yoshihide Arai, Hachioji (JP); Yoshiaki Koga, Hachioji (JP)

(73) Assignee: THREEBOND CO., LTD., Tokyo (JP)

( * ) Notice: Subject to any disclaimer, the term of this patent is extended or adjusted under 35 U.S.C. 154(b) by 707 days.

(21) Appl. No.: 16/642,530

(22) PCT Filed: Aug. 31, 2018

(86) PCT No.: PCT/JP2018/032468
§ 371 (c)(1),
(2) Date: Feb. 27, 2020

(87) PCT Pub. No.: WO2019/045071
PCT Pub. Date: Mar. 7, 2019

(65) Prior Publication Data
US 2021/0070894 A1   Mar. 11, 2021

(30) Foreign Application Priority Data

Sep. 1, 2017 (JP) ................... 2017-168245

(51) Int. Cl.
| | |
|---|---|
| C08F 2/48 | (2006.01) |
| C08K 5/5397 | (2006.01) |
| C08L 57/10 | (2006.01) |
| C08L 67/07 | (2006.01) |
| C08G 64/04 | (2006.01) |
| H01L 51/00 | (2006.01) |
| H10K 85/60 | (2023.01) |

(52) U.S. Cl.
CPC .............. *C08F 2/48* (2013.01); *C08G 64/045* (2013.01); *C08K 5/5397* (2013.01); *C08L 57/10* (2013.01); *C08L 67/07* (2013.01); *H10K 85/6572* (2023.02)

(58) Field of Classification Search
CPC ..... C08F 2/48; C08K 5/5397; H01L 51/0072; C08L 67/07; C08L 57/10; C08G 64/045
See application file for complete search history.

(56) References Cited

U.S. PATENT DOCUMENTS

| | | |
|---|---|---|
| 2003/0047722 A1 | 3/2003 | Fujita et al. |
| 2007/0188864 A1 | 8/2007 | Duncan et al. |
| 2015/0024218 A1 | 1/2015 | Koga et al. |
| 2016/0329522 A1 | 11/2016 | Hagihara et al. |
| 2017/0029671 A1 | 2/2017 | Sawanobori et al. |

FOREIGN PATENT DOCUMENTS

| | | | | |
|---|---|---|---|---|
| CN | 1418318 | A | 5/2003 | |
| CN | 101226254 | A | 7/2008 | |
| CN | 101384649 | A | 3/2009 | |
| CN | 104169388 | A | 11/2014 | |
| JP | 2000-044810 | A | 2/2000 | |
| JP | 2003026715 | A | 1/2003 | |
| JP | 2003-105033 | A | 4/2003 | |
| JP | 2003105033 | A * | 4/2003 | ........ C08F 222/1006 |
| JP | 2004-130540 | A | 4/2004 | |
| JP | 2006-249352 | A | 9/2006 | |
| JP | 2009-8755 | A | 1/2009 | |
| JP | 2013-125598 | A | 6/2013 | |
| JP | 2017-511424 | A | 4/2017 | |
| JP | 2018-100353 | A | 6/2018 | |
| WO | 2015/098647 | A1 | 7/2015 | |

OTHER PUBLICATIONS

Decision of refusal dated May 25, 2022, in connection with corresponding CN Application No. 201880056678.8, (19 pages, including machine-generated English translation).
International Search Report and Written Opinion dated Nov. 27, 2018 in corresponding International Application No. PCT/JP2018/032468; 12 pages; Partial translation attached.
Office Action dated Mar. 16, 2022 in Japanese Patent Application No. 2019-539683 (with English translation); 8 pages.
Office Action dated Oct. 20, 2021, in connection with corresponding Chinese Application No. 201880056678.8 (18 pp., including machine-generated English translation).
Office Action dated Nov. 23, 2022, in corresponding Korea Patent Application No. 10-2020-7002696, 8 pages.

\* cited by examiner

*Primary Examiner* — Robert D Harlan
(74) *Attorney, Agent, or Firm* — Maier & Maier, PLLC

(57) ABSTRACT

Conventionally, a photocurable composition to which an ultraviolet absorber is added is difficult to form a colorless and transparent cured resin because the ultraviolet absorber itself is colored, and thus the photocurable composition is hardly to be used in a display apparatus required for colorlessness and transparency. Provided is a photocurable composition including a specific compound, wherein a light transmittance of 385 nm is 50% or less and a yellowness index is 3.0 or less in a state in which a cured resin having a thickness of 200 μm or less is interposed between alkali free glass plates each having a thickness of 0.7 mm.

16 Claims, No Drawings

PHOTOCURABLE COMPOSITION

TECHNICAL FIELD

The present invention relates to a photocurable composition capable of implementing a cured resin with less coloration while containing an ultraviolet absorber.

BACKGROUND

In WO 2015/098647, it is described that there is a problem that an organic layer such as a light emitting layer of an organic EL device is easily deteriorated by ultraviolet rays, and as a countermeasure for this, an organic layer covered with a resin layer containing an ultraviolet absorber is described. However, in the invention of WO 2015/098647, the resin layer is made of an elastomer or rubber, an adhesive strength is low, which may cause poor results in a reliability test. Meanwhile, in a case where an ultraviolet absorber is added to a photocurable resin having a high adhesive strength, it is difficult to form a colorless and transparent cured resin because the ultraviolet absorber itself is colored, and in the worst case, photocurability is degraded due to adverse effects of the ultraviolet absorber. Since a colorless and transparent curable resin is required to be used in a display apparatus, a colored curable resin cannot be used.

Patent Literature

Patent Literature 1: WO 2015/098647

SUMMARY

Conventionally, in a case where an ultraviolet absorber is added to a photocurable composition, it is difficult to form a colorless and transparent cured resin because the ultraviolet absorber itself is colored. Therefore, the conventional photocurable composition containing an ultraviolet absorber is hardly to be used in a display apparatus where colorlessness and transparency of the cured resin are required.

As a result of intensive studies to solve the above problems, the inventors of the present invention found a technique relating to a photocurable composition capable of implementing a cured resin which is almost colorless and transparent while containing an ultraviolet absorber, thereby completing the present invention.

It should be noted that in the present specification, expressions of "to" or "from" represent a range of an upper limit value and a lower limit value, and the upper and lower limit values themselves are also included in the range. In addition, unless otherwise specified, an operation and a measurement of physical properties and the like are performed under conditions of room temperature (20 to 25° C.)/relative humidity of 40 to 50%. In addition, the term "(meth) acrylate" includes both of methacrylate and acrylate.

Hereinafter, the gist of the present invention will be described. A first aspect of the present invention is a photocurable composition including a compound of the following General Formula 1 as a component (A), wherein a light transmittance of 385 nm is 50% or less and a yellowness index is 3.0 or less in a state in which a cured resin of the photocurable composition with a thickness of 200 μm or less is interposed between alkali free glass plates each having a thickness of 0.7 mm.

[Chemical Formula 1]

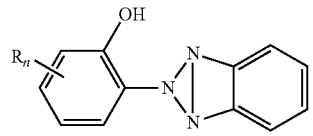

General Formula 1

(n is an integer of 1 to 4, R is a hydrocarbon group having a total number of carbon atoms of 6 or more, and hydrogen in a main skeleton of the compound may be substituted with another organic group, where a multimer is excluded.)

A second aspect of the present invention is the photocurable composition according to the first aspect, wherein a light transmittance of 385 nm is 30% or less and a yellowness index is 3.0 or less in a state in which a cured resin of the photocurable composition with a thickness of 200 μm or less is interposed between alkali free glass plates each having a thickness of 0.7 mm.

A third aspect of the present invention is the photocurable composition according to the first or second aspect, further including: a (meth)acrylate compound as a component (B); a film-forming resin as a component (C); and a photoinitiator as a component (D).

A fourth aspect of the present invention is the photocurable composition according to the third aspect, wherein the component (B) includes a (meth)acrylate oligomer and a (meth)acrylate monomer.

A fifth aspect of the present invention is the photocurable composition according to the fourth aspect, wherein the (meth)acrylate oligomer is a urethane-modified (meth)acrylate oligomer.

A sixth aspect of the present invention is the photocurable composition according to the fifth aspect, wherein a main skeleton of the urethane-modified (meth)acrylate oligomer is polycarbonate.

A seventh aspect of the present invention is the photocurable composition according to the fourth aspect, wherein a main skeleton of the (meth)acrylate monomer is polyether.

An eighth aspect of the present invention is the photocurable composition according to any one of the third to seventh aspects, wherein the component (C) is a phenoxy resin.

A ninth aspect of the present invention is the photocurable composition according to any one of the third to eighth aspects, wherein the component (D) includes an acylphosphineoxide-based photoinitiator.

A tenth aspect of the present invention is the photocurable composition according to any one of the first to ninth aspects, wherein a content of the component (A) is 0.1 to 2.0% by mass with respect to a total composition.

An eleventh aspect of the present invention is the photocurable composition according to any one of the first to tenth aspects, wherein the photocurable composition is used in assembling an organic EL device.

A twelfth aspect of the present invention is a photocurable sheet including the photocurable composition according to any one of the first to tenth aspects.

A thirteenth aspect of the present invention is a display apparatus using the photocurable composition according to any one of the first to tenth aspects.

A fourteenth aspect of the present invention is an adhering method including: a step of attaching the photocurable sheet according to the twelfth aspect to one adherend and sticking another adherend to the photocurable sheet; and a step of curing the photocurable sheet by irradiation with an energy ray to adhere the two adherends.

A fifteenth aspect of the present invention is a method of producing a display apparatus, including the adhering method according to the fourteenth aspect.

The photocurable composition of the present invention can be appropriately used in a display apparatus because the ultraviolet rays are hardly transmitted therethrough from the outside and an almost colorless and transparent cured resin can be formed.

DESCRIPTION OF EMBODIMENTS

Hereinafter, the present invention will be described in detail. A component (A) that can be used in the present invention is a compound of the General Formula 1. Here, n is an integer of 1 to 4, R is a hydrocarbon group having a total number of carbon atoms of 6 or more, and preferably a hydrocarbon group having a total number of carbon atoms of 6 to 19. Hydrogen in a main skeleton of the General Formula 1 may be substituted with another organic group. In addition, in the compound of the Formula 1, a multimer is excluded. Here, a multimer refers to a compound having a plurality of main skeletons of the General Formula 1 in a molecule.

[Chemical Formula 2]

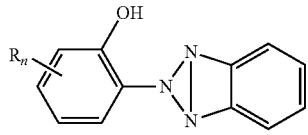

General Formula 1

The component (A) serves as an ultraviolet absorber, and the component (A) may be used alone or as a mixture of two or more kinds thereof. When the component (A) is added to a photocurable composition, a light transmittance of 385 nm is 50% or less and a yellowness index is 3.0 or less in a state in which a cured resin of the photocurable composition with a thickness of 200 μm or less is interposed between alkali free glass plates each having a thickness of 0.7 mm, such that an excellent photocurability of the composition and an excellent appearance, transmittance, and yellowness index of the cured resin can be kept. The light transmittance of 385 nm in the above state is preferably 40% or less and more preferably 30% or less. The light transmittance and the yellowness index can be measured and calculated by ultraviolet-visible spectroscopy.

Specific examples of the component (A) include, but not limited to, 2-(2'-hydroxy-5'-tert-octylphenyl)benzotriazole, 2-(2'-hydroxy-3'-tert-butyl-5'-methylphenyl)-5-chlorobenzotriazole, 2-(3,5-di-tert-amyl-2-hydroxyphenyl)benzotriazole, and the like.

A content of the component (A) may be preferably 0.1 to 4.0% by mass, more preferably 1.0 to 3.0% by mass, and still more preferably 1.1 to 2.0% by mass, with respect to the total composition excluding a solvent. When the content of the component (A) is 0.1% by mass or more, the ultraviolet rays can be prevented from entering, and when the content of the component (A) is 4.0% by mass or less, the appearance of the composition can be transparent.

A component (B) that can be used in the present invention may be a compound having a photocurable functional group, examples of the functional group include, but not limited to, a (meth)acryloyl group (hereinafter, an acryloyl group and a methacryloyl group are collectively referred to as a (meth)acryloyl group and a compound having a (meth)acryloyl group is referred to as a (meth)acrylate)), a (meth)acrylamide group (hereinafter, an acrylamide group and a methacrylamide group are collectively referred to as a (meth)acrylamide group), and the like. Preferably, the component (B) is a (meth)acryloyl group. In the component (B), it is preferable to use an oligomer and a monomer in combination from the viewpoint of improving an adhesive strength and decreasing a viscosity.

As an oligomer that can be used in the component (B), a (meth)acrylate oligomer is preferable, and a urethane-modified (meth)acrylate oligomer is particularly preferable from the viewpoint of improving an adhesive force. The oligomer is synthesized from a reaction product of a polyol compound having two or more hydroxyl groups in a molecule, a compound having two or more isocyanate groups in a molecule, and a (meth)acrylate having at least one hydroxyl group in a molecule.

In addition, a weight average molecular weight of an oligomer is preferably 10000 to 100000, more preferably 25000 to 90000, and particularly preferably 30000 to 80000. When the weight average molecular weight of the oligomer is more than 10000, curing properties are excellent, and when the weight average molecular weight is less than 100000, a viscosity is low and a compatibility at an interface when the composition is stuck to an adherend is excellent. Here, the weight average molecular weight refers to a weight average molecular weight in terms of polystyrene measured by gel permeation chromatography.

Examples of the polyol compound having two or more hydroxyl groups in a molecule include polyether polyol, polyester polyol, caprolactone diol, bisphenol polyol, polyisoprene polyol, hydrogenated polyisoprene polyol, polybutadiene polyol, hydrogenated polybutadiene polyol, castor oil polyol, polycarbonate diol, and the like. Among them, polycarbonate diol, polybutadiene polyol, and hydrogenated polybutadiene polyol are preferable from the viewpoint of excellent transparency and durability, and polycarbonate diol is particularly preferable from the viewpoint of preventing cloudiness of a cured resin in a high temperature-high humidity atmosphere. These may be used alone or in combination of two or more.

Examples of the compound having two or more isocyanate groups in a molecule include aromatic polyisocyanate, alicyclic polyisocyanate, aliphatic polyisocyanate, and the like, and among them, aliphatic polyisocyanate and alicyclic polyisocyanate are preferable from the viewpoint of obtaining a flexible cured resin. Examples of the aromatic polyisocyanate include 2,4-tolylene diisocyanate, 2,6-tolylene diisocyanate, 1,3-xylylene diisocyanate, 1,4-xylylene diisocyanate, tetramethyl xylylene diisocyanate, diphenylmethane diisocyanate, naphthalene-1,5-diisocyanate, triphenylmethane triisocyanate, and the like. Examples of the alicyclic polyisocyanate include isophorone diisocyanate, bis(4-isocyanatocyclohexyl) methane, 1,3-bis(isocyanatomethyl)cyclohexane, 1,4-bis(isocyanatomethyl)cyclohexane, norbornane diisocyanate, bicycloheptane triisocyanate, and the like. Examples of the aliphatic polyisocyanate include hexamethylene diisocyanate, 1,3,6-hexamethylene triisocyanate, 1,6,11-undecatriisocyanate, and the like. Among them, diisocyanate such as isophorone diisocyanate or hexamethylene diisocyanate is preferable. These may be used alone or in combination of two or more.

Examples of the (meth)acrylate having at least one hydroxyl group in a molecule include mono(meth)acrylate of dihydric alcohol such as ethylene glycol, propylene glycol, 1,3-propanediol, 1,3-butanediol, 1,4-butanediol, or polyethylene glycol; mono(meth)acrylate or di(meth)acrylate of trihydric alcohol such as trimethylolethane, trimethylolpropane, or glycerin; or the like. Among them, mono (meth)acrylate of dihydric alcohol is preferable, and mono (meth)acrylate of ethylene glycol is more preferable, from the viewpoint of obtaining a cured resin excellent in flexibility. These may be used alone or in combination of two or more.

A method of synthesizing a urethane-modified (meth) acrylate oligomer is not particularly limited, and a known method can be used. For example, a urethane prepolymer is obtained by reacting a polyol compound having two or more hydroxyl groups in a molecule with an isocyanate compound having two or more isocyanate groups in a molecule in a diluent (for example, methyl ethyl ketone, methoxy phenol, and the like) at a molar ratio (polyol compound:isocyanate compound) of preferably 3:1 to 1:3 and more preferably 2:1 to 1:2. A method including, after that, synthesizing a urethane (meth)acrylate oligomer by further reacting the isocyanate group remaining in the obtained urethane prepolymer with a (meth)acrylate having at least one hydroxyl group in a molecule in a sufficient amount to react with the isocyanate group is exemplified. In addition, examples of a catalyst used in the synthesis can include lead oleate, tetrabutyl tin, antimony trichloride, triphenyl aluminum, trioctyl aluminum, dibutyltin dilaurate, copper naphthenate, zinc naphthenate, zinc octylate, zinc octenoate, zirconium naphthenate, cobalt naphthenate, tetra-n-butyl-1,3-diacetyloxydistannoxane, triethylamine, 1,4-diaza[2,2,2]bicyclooctane, N-ethylmorpholine, and the like, and among them, dibutyltin dilaurate, zinc naphthenate, zinc octylate, and zinc octenoate are preferably used in terms of high activity and obtaining a cured resin having excellent transparency. These catalysts are preferably used in an amount of 0.0001 to 10 parts by mass with respect to 100 parts by mass of the total mass of a reactant. In addition, a reaction temperature is typically 10 to 100° C. and particularly preferably 30 to 90° C. A urethane-modified (meth)acrylate oligomer that is diluted with a solvent or the following monomer at a raw material stage may be used.

Examples of a monomer that can be used in the component (B) include monofunctional, difunctional, trifunctional, and multifunctional of tetrafunctional or higher monomers. The monomer is preferably a (meth)acrylate monomer, and particularly preferably a difunctional (meth)acrylate monomer. In order to decrease a viscosity of the composition, a molecular weight of the monomer is preferably 10000 or less, more preferably 5000 or less, and most preferably 1000 or less.

Examples of the monofunctional monomer include lauryl (meth)acrylate, stearyl (meth)acrylate, tetrahydrofurfuryl (meth)acrylate, caprolactone-modified tetrahydrofurfuryl (meth)acrylate, cyclohexyl (meth) acrylate, dicyclopentanyl (meth) acrylate, isobornyl (meth)acrylate, benzyl (meth) acrylate, phenyl (meth) acrylate, phenoxyethyl (meth) acrylate, phenoxydiethylene glycol (meth) acrylate, phenoxytetraethylene glycol (meth) acrylate, nonylphenoxyethyl (meth) acrylate, butoxyethyl (meth)acrylate, 2-hydroxyethyl (meth)acrylate, 2-hydroxypropyl (meth) acrylate, glycerol (meth) acrylate, modified butyl (meth) acrylate, epichlorohydrin-modified phenoxy(meth)acrylate, N,N-dimethylaminoethyl (meth) acrylate, N,N-diethylaminoethyl (meth) acrylate, morpholino (meth)acrylate, and the like.

Examples of the difunctional monomer include neopentyl glycol di(meth)acrylate, bisphenol A di(meth)acrylate, epichlorohydrin-modified bisphenol A di(meth)acrylate, stearic acid-modified pentaerythritol di(meth)acrylate, dicyclopentenyl diacrylate, di(meth)acryloyl isocyanurate, and the like.

Examples of the trifunctional monomer include trimethylolpropane tri(meth)acrylate, pentaerythritol tri(meth)acrylate, epichlorohydrin-modified trimethylolpropane tri(meth) acrylate, epichlorohydrin-modified glycerol tri(meth) acrylate, tris(acryloyloxyethyl)isocyanurate, and the like.

Examples of the multifunctional monomer include ditrimethylolpropane tetra(meth)acrylate, pentaerythritol tetra (meth)acrylate, dipentaerythritol monohydroxy penta(meth) acrylate, alkyl-modified dipentaerythritol pentaacrylate, dipentaerythritol hexa(meth)acrylate, and the like. These polymerizable monomers can be used alone or as a mixture of two or more kinds thereof.

As the monomer, a (meth)acrylate having an ether bond and a (meth)acryloyl group is preferable, and a polyether monomer having 8 to 30 blocks of an ether bond in one molecule is most preferable. When a polyether monomer has less than 8 blocks of an ether bond, the monomers are separated from moisture permeating into a cured resin from the outside in a high temperature-high humidity atmosphere and the cured resin may thus be cloudy. Meanwhile, when a polyether monomer has more than 30 blocks of an ether bond, the monomers are crystallized and a cured resin may thus be cloudy. The number of functional groups may be one or more. These may be used alone or in combination of two or more.

Examples of the (meth)acrylate having an ether bond and a (meth)acryloyl group include polyethylene glycol mono (meth)acrylate, polyethylene glycol di(meth)acrylate, polypropylene glycol mono(meth)acrylate, polypropylene glycol di(meth)acrylate, polyoxytetramethylene glycol mono (meth)acrylate, polyoxytetramethylene glycol di(meth)acrylate, and the like. A molecular weight of the (meth)acrylate having an ether bond and a (meth)acryloyl group is preferably in a range of 200 to 5000 and more preferably 250 to 3000. Specific examples thereof include M-90G, AM-130G, M-90G, M-230G, A-400, A-600, APG-700, A-1000, 9G, 14G, 23G, 1206PE, and the like manufactured by Shin-Nakamura Chemical Co., Ltd., PDE-600, PDP-700, ADE-600, and the like manufactured by NOF CORPORATION, LIGHT ESTER 130MA, LIGHT ESTER 130MA, and LIGHT ESTER 130A, 14EG, 14EG-A, and the like manufactured by KYOEISHA CHEMICAL Co., Ltd, but are not limited thereto.

In order to decrease a viscosity of the composition and to increase handling ability of the composition, a blending amount of the monomer is preferably 100 parts by mass or less, more preferably 50 parts by mass or less, and still more preferably 10 parts by mass, with respect to 100 parts by mass of the oligomer.

A component (C) that can be used in the present invention is a film-forming resin. The component (B) is often in a liquid state in atmosphere at 25° C., and in order to make the photocurable composition a sheet shape in atmosphere at 25° C., a component (C) that is solid or has almost no fluidity in atmosphere at 25° C. is added (hereinafter, the photocurable composition of the present invention processed into a sheet shape referred to as a photocurable sheet). Unlike the composition in a liquid state at 25° C., by making the composition a sheet shape at 25° C., the composition does not protrude from an end of an adherend when the composition is stuck to a plate-like adherend. Specific examples of the component (C) include a thermoplastic resin, an elastomer, and the like, and the presence or the absence of a reactive functional group such as a (meth) acryloyl group or an epoxy group is not limited.

The particularly preferable component (C) is a phenoxy resin. The phenoxy resin is a polymer body obtained by polymerizing a multifunctional epoxy resin such as a bisphenol-type epoxy resin, and an epoxy group remains at a terminal of the phenoxy resin. A weight average molecular weight of the phenoxy resin is preferably 10000 to 100000. Specific examples of the phenoxy resin include a bisphenol-type phenoxy resin, a novolac-type phenoxy resin, a naphthalene-type phenoxy resin, a biphenyl-type phenoxy resin, and the like. These may be used alone or in combination of two or more. As the phenoxy resin, in particular, a bisphenol-type phenoxy resin is preferable from the viewpoint of favorable adhesion to glass or plastic of a protective panel. Among them, a copolymerized phenoxy resin of bisphenol A and bisphenol F is preferable from the viewpoint of compatibility with the component (B) of the present invention. These may be used alone or in combination of two or more.

Commercially available products can be used as the phenoxy resin of the component (C), and specific examples thereof include, but not limited to, PHENOTOHT series YP-50, YP-505, YP-55, YP-70, ZX-1356-2, FX-316, and the like manufactured by NIPPON STEEL & SUMIKIN CHEMICAL CO., LTD., jER series 1256, 4250, 4275, and the like manufactured by Mitsubishi Chemical Corporation, and PKHB, PKHC, PKHH, PKHJ, PKFE, and the like manufactured by TOMOE Engineering Co., Ltd. A component diluted with a solvent at a raw material stage may be used as the component (C).

An added amount of the component (C) in the present invention is preferably 1 to 50 parts by mass, more preferably 10 to 40 parts by mass, and still more preferably 20 to 40 parts by mass, with respect to 100 parts by mass of the component (B). When the added amount of the component (C) is 1 part by mass or more, film formability is maintained and stickiness of the photocurable composition is not easily generated. Meanwhile, when the added amount of the component (C) is 50 parts by mass or less, a cured resin does not become excessively brittle.

A component (D) used in the present invention is a photoinitiator. The photoinitiator is a compound that generates radical species, cation species, or anion species by being decomposed by irradiating active energy rays such as ultraviolet rays or visible light.

Examples of the component (D) include an acetophenone-based photoinitiator, a benzoin-based photoinitiator, a benzophenone-based photoinitiator, a thioxanthone-based photoinitiator, an acylphosphineoxide-based photoinitiator, and the like. These photoinitiators may be used alone or in combination of two or more kinds thereof. In a case where an acylphosphineoxide-based photoinitiator that is easily cured by energy rays in the visible light region is added to the composition, the composition itself tends to be yellow, but photocurability is increased. Therefore, it is preferable that the composition includes an acylphosphineoxide-based photoinitiator.

Examples of the acetophenone-based photoinitiator include, but not limited to, diethoxy acetophenone, 2-hydroxy-2-methyl-1-phenylpropan-1-one, benzyldimethylketal, 4-(2-hydroxyethoxy)phenyl-(2-hydroxy-2-propyl)ketone, 1-hydroxycyclohexylphenylketone, 2-methyl-2-morpholino(4-thiomethylphenyl)propan-1-one, 2-benzyl-2-dimethylamino-1-(4-morpholinophenyl)butanone, a 2-hydroxy-2-methyl-1-[4-(1-methylvinyl)phenyl]propanone oligomer, and the like.

Examples of the benzoin-based photoinitiator include, but not limited to, benzoin, benzoin methyl ether, benzoin ethyl ether, benzoin isopropyl ether, benzoin isobutyl ether, and the like.

Examples of the benzophenone-based photoinitiator include, but not limited to, benzophenone, methyl o-benzoylbenzoate, 4-phenylbenzophenone, 4-benzoyl-4'-methyldiphenylsulfide, 3,3',4,4'-tetra(t-butylperoxycarbonyl)benzophenone, 2,4,6-trimethylbenzophenone, 4-benzoyl-N,N-dimethyl-N-[2-(1-oxo-2-propenyloxy)ethyl]benzene metanaminium bromide, and (4-benzoylbenzyl)trimethylammonium chloride.

Examples of the thioxanthone-based photoinitiator include, but not limited to, 2-isopropylthioxanthone, 4-isopropylthioxanthone, 2,4-diethylthioxanthone, 2,4-dichlorothioxanthone, 1-chloro-4-propoxythioxanthone, 2-(3-dimethylamino-2-hydroxy)-3,4-dimethyl-9H-thioxanthone-9-onemethochloride, and the like.

Examples of the acylphosphineoxide-based photoinitiator include, but not limited to, bis(2,4,6-trimethylbenzoyl)-phenylphosphine oxide, 2,4,6-trimethylbenzoyl-diphenylphosphine oxide, 2,4,6-trimethylbenzoylphenylethoxyphosphine oxide, and the like.

An added amount of the component (D) is preferably 0.1 to 5.0 parts by mass with respect to 100 parts by mass of the component (B). When the added amount of the component (D) is more than 5.0 parts by mass, the composition may be colored. In addition, the amount of component (A) is preferably 0.1 to 4.0 parts by mass, and more preferably 0.5 to 3.5 parts by mass, with respect to 1.0 part by mass of the component (D). When the amount of component (A) is more than 0.1 parts by mass, ultraviolet rays are not easily transmitted from the outside, and when the amount of component (A) is less than 4.0 parts by mass, a cured resin tends to be colorless and photocurability does not deteriorate.

In the present invention, in order to process the photocurable composition into a sheet shape, a solvent can be used. Examples of the solvent include alcohols such as methanol or ethanol; a chlorinated solvent such as dichloroethane or trichloroethane; a fluorinated solvent such as trichlorofluoroethane; a ketone solvent such as acetone, methyl ethyl ketone, or methyl isobutyl ketone; an ester solvent such as methyl acetate, ethyl acetate, propyl acetate, or butyl acetate; ethers such as dimethyl ether or methyl ethyl ether; a hydrocarbon solvent such as pentane, hexane, heptane, or cyclohexane; and an aromatic solvent such as benzene, toluene, and xylene, and the like. A ketone solvent is preferable in consideration of compatibility between the component (B) and the component (C) of the present invention.

An added amount of the solvent is preferably 50 to 200 parts by mass with respect to 100 parts by mass of the total mass of the components (A) to (D), and in this range, when the photocurable composition is formed in a sheet shape, a film thickness can be 200 µm or less.

In addition, as other components, within a range in which the object of the present invention is not impaired, the following additives may be appropriately blended: a silane coupling agent, a filler such as an inorganic filler or an organic filler, a storage stabilizer, an antioxidant, a light stabilizer, an adhesive aid, a plasticizer, a dye, a pigment, a flame retardant, a sensitizer, a thermal initiator, a heavy-metal deactivator, an ion trapping agent, an emulsifier, a water dispersion stabilizer, an antifoamer, a release agent, a leveling agent, wax, a rheology controlling agent, and a surfactant.

Specific examples of the silane coupling agent include a glycidyl group-containing silane coupling agent such as 2-(3,4-epoxycyclohexyl)ethyltrimethoxysilane, 3-glycidoxypropyltriethoxysilane, 3-glycidoxypropylmethyldimethoxysilane, 3-glycidoxypropyltrimethoxysilane, or 3-glycidoxypropylmethyldiethoxysilane; a vinyl group-containing silane coupling agent such as vinyltris(β-methoxyethoxy)silane, vinyltriethoxysilane, or vinyltrimethoxysilane; a (meth)acrylic group-containing silane coupling agent such as γ-methacryloxypropyltrimethoxysilane; an amino group-containing silane coupling agent such as N-β-(aminoethyl)-γ-aminopropyltrimethoxysilane, γ-aminopropyltriethoxysilane, or N-phenyl-γ-aminopropyltrimethoxysilane; and other γ-mercaptopropyltrimethoxysilane and γ-chloropropyltrimethoxysilane. These may be used alone or in combination of two or more kinds thereof. Among them, an epoxy group or (meth)acrylic group-containing silane coupling agent is preferably used, from the viewpoint that further improved adhesion can be expected.

Examples of the inorganic filler include glass powder, fumed silica powder, silica powder, alumina powder, mica powder, silicone rubber powder, calcium carbonate powder, aluminum nitride powder, carbon powder, kaolin clay powder, dry clay mineral powder, dry diatomaceous earth powder, metal powder, and the like. In addition, an example of the fumed silica powder include powder and the like obtained by chemically modifying (hydrophobizing) a surface thereof with organochlorosilanes, polyorganosiloxane, hexamethyldisilazane, or the like, and examples of commercially available products thereof include AEROSIL series R974, R972, R972V, R972CF, R805, R812, R812S, R816, R8200, RY200, RX200, RY200S, R202, and the like manufactured by Nippon Aerosil Co., Ltd. For the purpose of improving fluidity or the like, or the purpose of increasing a mechanical strength of a cured resin, a blending amount of the inorganic filler is preferably about 0.1 to 100 parts by weight with respect to 100 parts by weight of the total weight of the components (A) to (D).

As a method of processing the photocurable composition of the present invention into a sheet shape, a known technology can be used. For example, the photocurable composition is processed into a sheet shape by preparing a crude liquid of which a viscosity is intentionally decreased by adding a solvent to the photocurable composition, coating a release film having a surface subjected to a release treatment in advance with the crude liquid, and then drying the solvent. In addition, a release film may be stuck to one surface or both surfaces of a photocurable sheet. As a specific example of the coating, coating can be performed by a flow coating method, a roll coating method, a gravure roll method, a wire bar method, a lip die coating method, and the like. In addition, as a drier in the drying, a hot air drying furnace, an IR furnace, or the like can be used. Examples of a material of the release film include a plastic film such as a polyethylene, polypropylene, polyethylene terephthalate, or polyester film, paper, cloth, non-woven fabric, and the like, and a plastic film is preferable from the viewpoint of a releasing property. A thickness of the release film is preferably 5 to 300 μm and more preferably 25 to 200 μm. The release film is preferably subjected to a release treatment by a fluorine compound, a silicone compound, a long-chain alkyl compound, and the like.

A colored state is changed depending on a thickness of a photocurable composition having a sheet shape. The composition is less colored as the thickness thereof is small. Therefore, the thickness of the photocurable composition having a sheet shape is preferably 200 μm or less and more preferably 150 μm. In a cured resin having a thickness of 200 μm or less, a light transmittance of 385 nm is 50% or less and a yellowness index is 3.0 or less in a state of being interposed between alkali free glass plates each having a thickness of 0.7 mm. As the alkali free glass plate, 1737, EAGLE 2000, EAGLE XG, and the like manufactured by Corning Inc. can be used.

The photocurable composition of the present invention can be cured by irradiation with energy rays such as ultraviolet rays and visible light. Irradiation light in a wavelength region of 150 to 750 nm is preferable, and the curing can be performed with an integrated intensity of light of 1 to 100 kJ/m$^2$ and preferably 5 to 70 kJ/m$^2$ using a low pressure mercury lamp, a medium pressure mercury lamp, a high pressure mercury lamp, an ultrahigh pressure mercury lamp, a xenon lamp, a metal halide lamp, or an LED lamp.

The photocurable composition of the present invention can be used in assembling of a display apparatus such as a liquid crystal display or an organic EL display. Specifically, the photocurable composition is suitable for assembling a display device, a cover panel, a touch panel, or the like to a display apparatus, or assembling an organic EL device itself.

A process of adhering two transparent adherends using a photocurable sheet having one surface to which a release film is stuck will be described below. The adhering process includes a laminating step and a curing step. In the laminating step, sticking is performed while a pressure and heat are applied by a laminator in a state in which a side of a photocurable sheet on which a release film is not attached is attached to one adherend. Thereafter, the release film is peeled off, and another adherend is similarly stuck to the photocurable sheet by the laminator. Finally, the photocurable sheet is cured by irradiation with energy rays, whereby two adherends can be adhered to each other. In the laminating step, a set pressure of an apparatus varies depending on the type of apparatus and an area of an adherend, and it is preferable that a pressure is applied with 0.1 to 0.3 MPa. In the laminating step, a set temperature of the apparatus is preferably 40 to 100° C. in consideration of thermal damage of the adherend. A vacuum press machine, a vacuum laminator, an autoclave, or the like that can perform sticking in vacuum or reduced pressure atmosphere may be used instead of the laminator. The adhering process is not limited thereto.

EXAMPLES

Next, the present invention will be described in more detail with reference to Examples, but the present invention is not limited to only these Examples. (Hereinafter, a photocurable composition is simply referred to as a composition, and a photocurable composition formed into a sheet shape is referred to as a sheet.)

Examples 1 to 3 and Comparative Examples 1 to 9

The following components were prepared to prepare a composition.
Component (A): Compound having specific structure
2-(2'-hydroxy-5'-tert-octylphenyl)benzotriazole (in General Formula 1, the total number of carbon atoms of R is 54) (JF-83 manufactured by JOHOKU CHEMICAL CO., LTD.)
2-(T-hydroxy-3'-tert-butyl-5'-methylphenyl)-5-chlorobenzotriazole (in General Formula 1, the total number of carbon atoms of R is 5) (JF-79 manufactured by JOHOKU CHEMICAL CO., LTD.)

2-(3,5-di-tert-amyl-2-hydroxyphenyl)benzotriazole (in General Formula 1, the total number of carbon atoms of R is 10) (SEESORB704 manufactured by SHIPRO KASEI KAISHA, LTD.)

Component (A'): Compound other than component (A)

2-(5-chloro-2-benzotriazolyl)-6-tert-butyl-p-cresol (in General Formula 1, the total number of carbon atoms of R is 5) (LA-36 manufactured by ADEKA CORPORATION)

2,2',4,4'-tetrahydrobenzophenone (not in a structure of General Formula 1) (Uvinu13050 manufactured by BASF SE)

6-(2-benzotriazolyl)-4-tert-octyl-6'-tert-butyl-4'-methly-2,2'-methylenebisphenol (in General Formula 1, the total number of carbon atoms of R is 20) (JAST-500 manufactured by JOHOKU CHEMICAL CO., LTD.)

2-(2'-hydroxy-5'-methacryloxyethylphenyl)-2H-benzotriazole (in General Formula 1, R is not a hydrocarbon group) (RUVA-93 manufactured by Otsuka Chemical Co., Ltd.)

Ethyl 2-cyano-3,3-diphenylacrylate (not in a structure of General Formula 1) (SEESORB501 manufactured by SHIPRO KASEI KAISHA, LTD.)

2-Ethylhexyl 2-cyano-3,3-diphenylacrylate (not in a structure of General Formula 1) (SEESORB502 manufactured by SHIPRO KASEI KAISHA, LTD.)

2,2'-Methylenebis [6-(2H-benzotriazol-2-yl)-4-tert-octylphenol] (dimer) (JF-832 manufactured by JOHOKU CHEMICAL CO., LTD.)

Component (B): (Meth)acrylate compound

Urethane-modified acrylate oligomer having polycarbonate in a main skeleton (50% diluted isobornylmethacrylate) (UN-004RU manufactured by Negami Chemical Industrial Co., Ltd.)

Polyethylene glycol #1000 dimethacrylate (NK ester 23G manufactured by Shin-Nakamura Chemical Co., Ltd.)

Polyethylene glycol #600 dimethacrylate (NK ester 14G manufactured by Shin-Nakamura Chemical Co., Ltd.)

Component (C): Film-forming resin

Bisphenol A-type epoxy resin/bisphenol F-type mixing type (solid content 100%), Weight average molecular weight: 60000 (jER4250 manufactured by Mitsubishi Chemical Corporation)

Component (D): Photoinitiator 2,4,6-Trimethylbenzoyl-diphenyl-phosphine oxide (IRGACURE TPO manufactured by BASF SE)

Other components

3-Methacryloxypropyltrimethoxysilane (KBM-503 manufactured by Shin-Etsu Chemical Co., Ltd.)

Solvent

Methyl ethyl ketone (reagent)

The components (A) to (D), other components, and the solvent were weighed in a stirring pot and stirred in atmosphere at 25° C. for 1 hour. If methyl ethyl ketone was volatilized from the total weight thereof before stirring, methyl ethyl ketone was supplemented by the volatilized weight. The detailed preparation amounts are followed by Table 1, and numerical values were all represented by parts by mass. In addition, a ratio of the component (A) (or component (A')) in the total composition excluding the solvent was represented by % by mass.

The compositions of Examples 1 to 3 and Comparative Examples 1 to 8 each were coated on the release film with a clearance of 200 μm using a coating machine, and dried by passing through a drying line having a length of 1.5 m in atmosphere at 80° C. and two drying lines each having a length of 1.5 m in atmosphere at 110° C. at a speed of 500 mm/min, thereby forming the composition into a sheet shape. Thereafter, another release film was stuck thereto, thereby preparing a sheet to which two types of release films are attached. A thickness of the sheet including the release films was measured by a thickness gage, and the "film thickness (after drying)" after the thicknesses of the two types of release films were subtracted is described in Table 1. In the drying for volatilizing the solvent, since the solvent is dried from a surface, the internal solvent is less likely to be volatilized. Therefore, when the film thickness is increased, bubbles remain in the coated film, and the clearance is thus preferably 300 μm or less.

TABLE 1

| Component | Raw material | Example 1 | Example 2 | Example 3 | Comparative Example 1 | Comparative Example 2 | Comparative Example 3 |
|---|---|---|---|---|---|---|---|
| Component (A) | JF-83 | 2.8 | | | | | |
| | JF-79 | | 1.4 | | | | |
| | SEESORB704 | | | 2.8 | | | |
| Component (A') | LA-36 | | | | | 2.8 | |
| | Uvinul3050 | | | | | | 2.8 |
| | JAST-500 | | | | | | |
| | RUVA-93 | | | | | | |
| | SEESORB501 | | | | | | |
| | SEESORB502 | | | | | | |
| | JF-832 | | | | | | |
| Component (B) | UN-004RU | 96 | 96 | 96 | 96 | 96 | 96 |
| | NK ester 23G | 1.3 | 1.3 | 1.3 | 1.3 | 1.3 | 1.3 |
| | NK ester 14G | 2.7 | 2.7 | 2.7 | 2.7 | 2.7 | 2.7 |
| Component (C) | jER4250 | 34 | 34 | 34 | 34 | 34 | 34 |
| Component (D) | TPO | 1.0 | 1.0 | 1.0 | 1.0 | 1.0 | 1.0 |
| Other components | KBM-503 | 1.3 | 1.3 | 1.3 | 1.3 | 1.3 | 1.3 |
| Solvent | Methyl ethyl ketone | 140.0 | 140.0 | 140.0 | 140.0 | 140.0 | 140.0 |
| Total | | 279.1 | 277.7 | 279.1 | 276.3 | 279.1 | 279.1 |
| A ratio of component (A) (or component (A')) in total composition excluding solvent | | 2.0 | 1.0 | 2.0 | 0.0 | 2.0 | 2.0 |
| Film Thickness (after drying) | | 150 | 85 | 120 | 150 | 150 | 100 |

TABLE 1-continued

| Component | Raw material | Comparative Example 4 | Comparative Example 5 | Comparative Example 6 | Comparative Example 7 | Comparative Example 8 |
|---|---|---|---|---|---|---|
| Component (A) | JF-83 | | | | | |
| | JF-79 | | | | | |
| | SEESORB704 | | | | | |
| Component (A') | LA-36 | | | | | |
| | Uvinul3050 | | | | | |
| | JAST-500 | 1.4 | | | | |
| | RUVA-93 | | 2.8 | | | |
| | SEESORB501 | | | 1.4 | | |
| | SEESORB502 | | | | 1.4 | |
| | JF-832 | | | | | 1.4 |
| Component (B) | UN-004RU | 96 | 96 | 96 | 96 | 96 |
| | NK ester 23G | 1.3 | 1.3 | 1.3 | 1.3 | 1.3 |
| | NK ester 14G | 2.7 | 2.7 | 2.7 | 2.7 | 2.7 |
| Component (C) | jER4250 | 34 | 34 | 34 | 34 | 34 |
| Component (D) | TPO | 1.0 | 1.0 | 1.0 | 1.0 | 1.0 |
| Other components | KBM-503 | 1.3 | 1.3 | 1.3 | 1.3 | 1.3 |
| Solvent | Methyl ethyl ketone | 140.0 | 140.0 | 140.0 | 140.0 | 140.0 |
| | Total | 277.7 | 279.1 | 277.7 | 277.7 | 277.7 |
| A ratio of component (A) (or component (A')) in total composition excluding solvent | | 1.0 | 2.0 | 1.0 | 1.0 | 1.0 |
| Film Thickness (after drying) | | 105 | 105 | 90 | 85 | — |

Photocurability observation, appearance observation (after curing), transmittance measurement (after curing), and yellowness index measurement (after curing) were performed by using the sheets formed in Examples 1 to 3 and Comparative Examples 1 to 8. Hereinafter, the numbers of the compositions in Table 1 are reflected in the sheet as they are and are shown in Table 2.

[Photocurability Observation]

The sheet of length 30 mm×width 30 mm was cured by performing light irradiation with an integrated intensity of light of 30 kJ/m$^2$ by a belt conveyor type ultraviolet ray irradiator. The cured resin was rolled into a cylindrical shape with a diameter of 3 mm and placed into a hot air drying furnace in atmosphere at 80° C. for 5 minutes. After the temperature was lowered to room temperature, the "photocurability" was visually observed according to the following evaluation criteria. In a case where the cured resin is softened or dissolved by heating and a shape thereof cannot be maintained, the photocurability is not sufficient.

Evaluation Criteria

○: The cylindrical shape was maintained x: The cylindrical shape was not maintained

[Appearance Observation (after Curing)]

An alkali free glass plate of thickness 0.7 mm×width 25 mm×length 100 mm was attached to the sheet from which one release film was peeled off, and transfer was performed by a thermal roll laminator in which a roll temperature was set to 80° C. Thereafter, the other release film was peeled off, the alkali free glass plate was attached thereto, and sticking was performed in atmosphere at 80° C. using a vacuum laminator. A test piece where the sheet is stuck with the alkali free glass was prepared by irradiation with ultraviolet rays with an integrated intensity of light of 30 kJ/m$^2$ by a belt conveyor type ultraviolet ray irradiator. The appearance was visually observed according to the following evaluation criteria, and the results are denoted by "appearance (after curing)". In terms of securing the transparency, "○" is preferable.

Evaluation Criteria

○: An unmelted residue of the component was not observed.

x: An unmelted residue of the component was observed.

[Light Transmittance Measurement (after Curing)]

A transmittance was measured by ultraviolet-visible spectroscopy by using the same test piece as the test piece prepared in the appearance observation (after curing). The transmittance in a wavelength range of 800 nm to 300 nm was measured and a transmittance (%) of 385 nm was read. The number of tests n was 3, the average value was calculated, and the results are denoted by "light transmittance (after curing) (unit: %)" according to the following evaluation criteria. In a case where the appearance (after curing) was "x", the present measurement was not performed and denoted by "-". In order to block the ultraviolet rays that cause damage to the adherend, the transmittance in a wavelength of 385 nm is "⊙" or "○", and a numerical value thereof is 50% or less, preferably 40% or less, and most preferably 30% or less.

Evaluation Criteria

⊙: A transmittance in a wavelength of 385 nm is 5% or less

○: A transmittance in a wavelength of 385 nm is more than 5% and 50% or less x: A transmittance in a wavelength of 385 nm is more than 50%

[Yellowness Index Measurement (after Curing)]

A yellowness index was measured by ultraviolet-visible spectroscopy by using the same test piece as the test piece prepared in the appearance observation (after curing). The transmittance in a wavelength range of 800 nm to 300 nm was measured and a yellowness index was calculated in accordance with JIS K7373. The number of tests n was 3, the average value was calculated, and the results are denoted by "yellowness index (after curing)" according to the following evaluation criteria. In a case where the appearance (after curing) was "x", the present measurement was not performed and denoted by "-". In order to represent colorlessness and transparency, the yellowness index is "⊙" or "○", and a numerical value thereof is 3.0 or less.

Evaluation Criteria

⊙: A yellowness index is 1.0 or less

○: A yellowness index is more than 1.0 and 3.0 or less x: A yellowness index is more than 3.0

TABLE 2

| Test item | Example 1 | Example 2 | Example 3 | Comparative Example 1 | Comparative Example 2 | Comparative Example 3 |
|---|---|---|---|---|---|---|
| Photocurability | ◯ | ◯ | ◯ | ◯ | ◯ | ◯ |
| Appearance (after curing) | ◯ | ◯ | ◯ | ◯ | ◯ | ◯ |
| Light transmittance (after curing) | ◯ 25.0 | ◯ 11.1 | ◯ 9.8 | X 86.5 | ⊙ 0.1 | ⊙ 0.4 |
| Yellowness index (after curing) | ◯ 2.0 | ◯ 2.4 | ◯ 2.6 | ⊙ 0.8 | X 3.6 | X 3.2 |

| Test item | Comparative Example 4 | Comparative Example 5 | Comparative Example 6 | Comparative Example 7 | Comparative Example 8 |
|---|---|---|---|---|---|
| Photocurability | ◯ | ◯ | ◯ | ◯ | ◯ |
| Appearance (after curing) | ◯ | ◯ | ◯ | ◯ | X |
| Light transmittance (after curing) | X 53.5 | X 50.7 | X 83.7 | X 85.5 | — |
| Yellowness index (after curing) | ◯ 1.4 | ◯ 2.3 | ⊙ 0.8 | ⊙ 0.7 | — |

In the sheet including no component (A) of Comparative Example 1, the yellowness index is "0" and the light transmittance is "x". Therefore, the ultraviolet rays were transmitted to the cured resin. In Examples 1 to 3 of the present invention, both the light transmittance and the yellowness index are "0", and thus two characteristics of the light transmittance and the yellowness index are compatible, but in Comparative Examples 2 to 7, either the light transmittance or the yellowness index includes "x", and thus two characteristics cannot be compatible. In addition, in Examples 1 to 3 and Comparative Examples 1 to 7, the photocurability and the appearance (after curing) were "0". In addition, in Comparative Example 8, the sheet cannot be used due to the unmelted residue of the component.

INDUSTRIAL APPLICABILITY

According to the present invention, the photocurable composition can be used in assembling a display apparatus such as a liquid crystal display or an organic EL display, specifically, the photocurable composition is suitable for assembling a display device, a cover panel, a touch panel, or the like to a display apparatus, or assembling an organic EL device itself, such that an organic EL device can be prevented from deteriorating by the ultraviolet rays from the outside.

The invention claimed is:

1. A photocurable composition comprising a compound of the following General Formula 1 or 2-(2'-hydroxy-3'-tert-butyl-5'-methylphenyl)-5-chlorobenzotriazole as a component (A),
   a (meth)acrylate compound as a component (B);
   a film-forming resin as a component (C); and
   a photoinitiator as a component (D),
   wherein a light transmittance of 385 nm is 50% or less and a yellowness index is 3.0 or less in a state in which a cured resin of the photocurable composition with a thickness of 200 μm or less is interposed between alkali free glass plates each having a thickness of 0.7 mm:

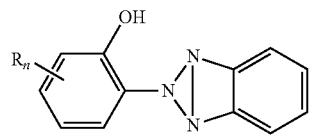

General Formula 1 n is an integer of 1 to 4, R is a hydrocarbon group having a total number of carbon atoms of 6 or more, and hydrogen in a main skeleton of the compound may be substituted with another organic group, where a multimer is excluded.

2. The photocurable composition according to claim 1, wherein a light transmittance of 385 nm is 30% or less and a yellowness index is 3.0 or less in a state in which a cured resin of the photocurable composition with a thickness of 200 μm or less is interposed between alkali free glass plates each having a thickness of 0.7 mm.

3. The photocurable composition according to claim 1, wherein the component (B) includes a (meth)acrylate oligomer and a (meth)acrylate monomer.

4. The photocurable composition according to claim 3, wherein the (meth)acrylate oligomer is a urethane-modified (meth)acrylate oligomer.

5. The photocurable composition according to claim 4, wherein a main skeleton of the urethane-modified (meth)acrylate oligomer is polycarbonate.

6. The photocurable composition according to claim 3, wherein a main skeleton of the (meth)acrylate monomer is polyether.

7. The photocurable composition according to claim 1, wherein the component (C) is a phenoxy resin.

8. The photocurable composition according to claim 1, wherein the component (D) includes an acylphosphineoxide-based photoinitiator.

9. The photocurable composition according to claim 1, wherein a content of the component (A) is 0.1 to 4.0% by mass with respect to a total composition excluding a solvent.

10. The photocurable composition according to claim 1, wherein the photocurable composition is used in assembling an organic EL device.

11. A photocurable sheet comprising the photocurable composition set forth in claim 1.

12. A display apparatus using the photocurable composition set forth in claim 1.

13. An adhering method comprising:
- a step of attaching the photocurable sheet set forth in claim 11 to one adherend and sticking another adherend to the photocurable sheet; and
- a step of curing the photocurable sheet by irradiation with an energy ray to adhere the two adherends.

14. A method of producing a display apparatus comprising the adhering method set forth in claim 13.

15. The photocurable composition according to claim 1, which comprises the compound of the General Formula 1 or 2-(T-hydroxy-3'-tert-butyl-5'-methylphenyl)-5-chlorobenzotriazole as a component (A), and
- when the component (A) is 2-(T-hydroxy-3'-tert-butyl-5'-methylphenyl)-5-chlorobenzotriazole, a content of the component (A) is 0.1 to 1.1% by mass with respect to a total composition excluding a solvent.

16. The photocurable composition according to claim 1, which comprises 2-(2'-hydroxy-5'-tert-octylphenyl)benzotriazole, 2-(2'-hydroxy-3'-tert-butyl-5'-methylphenyl)-5-chlorobenzotriazole, or 2-(3,5-di-tert-amyl-2-hydroxyphenyl)benzotriazole as a component (A), and
- when the component (A) is 2-(2'-hydroxy-3'-tert-butyl-5'-methylphenyl)-5-chlorobenzotriazole, a content of the component (A) is 0.1 to 1.1% by mass with respect to a total composition excluding a solvent.

* * * * *